(12) United States Patent
Miyagawa et al.

(10) Patent No.: US 9,147,698 B2
(45) Date of Patent: Sep. 29, 2015

(54) DISPLAY DEVICE AND CONTROLLING METHOD THEREOF

(71) Applicant: Semiconductor Energy Laboratory Co., Ltd., Atsugi-shi, Kanagawa-ken (JP)

(72) Inventors: Keisuke Miyagawa, Kanagawa (JP); Jun Koyama, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/321,874

(22) Filed: Jul. 2, 2014

(65) Prior Publication Data

US 2015/0001544 A1     Jan. 1, 2015

Related U.S. Application Data

(60) Continuation of application No. 13/591,511, filed on Aug. 22, 2012, now Pat. No. 8,773,333, which is a continuation of application No. 13/193,127, filed on Jul. 28, 2011, now Pat. No. 8,253,660, which is a (Continued)

(30) Foreign Application Priority Data

Oct. 31, 2002   (JP) ................................. 2002-318974

(51) Int. Cl.
*H01L 27/12*  (2006.01)
*G09G 3/32*   (2006.01)

(52) U.S. Cl.
CPC ............ *H01L 27/124* (2013.01); *G09G 3/3233* (2013.01); *G09G 2300/0426* (2013.01);

(Continued)

(58) Field of Classification Search
CPC ................... G09G 3/3688; G09G 2330/21
USPC ............... 345/76, 82, 204, 212, 690
See application file for complete search history.

(56) References Cited

U.S. PATENT DOCUMENTS 5,233,339 A    8/1993   Newman et al.
5,594,463 A    1/1997   Sakamoto (Continued)

FOREIGN PATENT DOCUMENTS

CN       001369916 A    9/2002
EP          0923067 A    6/1999

(Continued)

OTHER PUBLICATIONS

Office Action (Application No. 03756730.2) Dated Dec. 18, 2009.

(Continued)

*Primary Examiner* — Ricardo L Osorio
(74) *Attorney, Agent, or Firm* — Fish & Richardson P.C.

(57) ABSTRACT

A conventional setting voltage was a value with an estimated margin of a characteristic change of a light emitting element. Therefore, a voltage between the source and drain of a driver transistor $V_{ds}$ had to be set high ($V_{ds} \geq V_{gs} - V_{Th} + a$). This caused high heat generation and power consumption because a voltage applied to the light emitting element. The invention is characterized by feedbacking a change in a current value in accordance with the deterioration of a light emitting element and a power source voltage controller which modifies a setting voltage. Namely, according to the invention, the setting voltage is to be set in the vicinity of the boundary (critical part) between a saturation region and a linear region, and a voltage margin for the deterioration is not required particularly for an initial setting voltage.

18 Claims, 13 Drawing Sheets

Related U.S. Application Data continuation of application No. 12/573,998, filed on Oct. 6, 2009, now Pat. No. 7,999,769, which is a division of application No. 12/255,235, filed on Oct. 21, 2008, now Pat. No. 7,773,082, which is a continuation of application No. 11/675,116, filed on Feb. 15, 2007, now Pat. No. 7,453,453, which is a continuation of application No. 10/697,003, filed on Oct. 31, 2003, now Pat. No. 7,180,515.

(52) U.S. Cl.
CPC .............. *G09G2300/0842* (2013.01); *G09G 2300/0861* (2013.01); *G09G 2310/0251* (2013.01); *G09G 2320/029* (2013.01); *G09G 2320/0295* (2013.01); *G09G 2320/043* (2013.01); *G09G 2330/021* (2013.01); *G09G 2330/028* (2013.01)

(56) References Cited

U.S. PATENT DOCUMENTS

| | | |
|---|---|---|
| 5,949,194 A | 9/1999 | Kawakami et al. |
| 6,392,617 B1 | 5/2002 | Gleason |
| 6,396,466 B1 | 5/2002 | Pross et al. |
| 6,469,318 B2 | 10/2002 | Yamada et al. |
| 6,518,962 B2 | 2/2003 | Kimura et al. |
| 6,528,951 B2 | 3/2003 | Yamazaki et al. |
| 6,548,867 B2 | 4/2003 | Yamada et al. |
| 6,788,003 B2 | 9/2004 | Inukai et al. |
| 6,815,901 B2 | 11/2004 | Koyama |
| 6,858,991 B2 | 2/2005 | Miyazawa |
| 6,952,083 B2 | 10/2005 | Fukuzako |
| 7,023,407 B2 | 4/2006 | Nakanishi |
| 7,042,426 B2 | 5/2006 | Shin |
| 7,053,890 B2 | 5/2006 | Inukai |
| 7,180,515 B2 | 2/2007 | Miyagawa et al. |
| 7,218,297 B2 | 5/2007 | Inukai et al. |
| 7,274,363 B2 | 9/2007 | Ishizuka et al. |
| 7,298,347 B2 | 11/2007 | Yamazaki et al. |
| 7,453,453 B2 | 11/2008 | Miyagawa et al. |
| 7,773,082 B2 | 8/2010 | Miyagawa et al. |
| 7,999,769 B2 | 8/2011 | Miyagawa et al. |
| 8,253,660 B2 | 8/2012 | Miyagawa et al. |
| 8,441,418 B2 | 5/2013 | Honda |
| 2002/0011978 A1 | 1/2002 | Yamazaki et al. |
| 2002/0017643 A1 | 2/2002 | Koyama |
| 2002/0027229 A1 | 3/2002 | Yamazaki et al. |
| 2002/0033783 A1 | 3/2002 | Koyama |
| 2002/0039018 A1 | 4/2002 | Sanzo et al. |
| 2002/0044208 A1 | 4/2002 | Yamazaki et al. |
| 2002/0047550 A1 | 4/2002 | Tanada |
| 2002/0047568 A1 | 4/2002 | Koyama |
| 2002/0180672 A1 | 12/2002 | Yamazaki et al. |
| 2003/0132716 A1 | 7/2003 | Yamazaki et al. |
| 2003/0179163 A1 | 9/2003 | Tsuchida |
| 2005/0017964 A1 | 1/2005 | Yamazaki et al. |
| 2005/0030264 A1 | 2/2005 | Tsuge et al. |
| 2005/0041002 A1 | 2/2005 | Takahara et al. |
| 2006/0038758 A1 | 2/2006 | Routley et al. |

FOREIGN PATENT DOCUMENTS

| | | |
|---|---|---|
| EP | 1096466 A | 5/2001 |
| EP | 1168291 A | 1/2002 |
| EP | 1193741 A | 4/2002 |
| EP | 1227467 A | 7/2002 |
| EP | 1227467 B | 11/2006 |
| EP | 2437246 A | 4/2012 |
| JP | 2002-072964 A | 3/2002 |
| JP | 2002-108285 A | 4/2002 |
| JP | 2002-176063 A | 6/2002 |
| JP | 2002-304155 A | 10/2002 |
| JP | 2003-202837 A | 7/2003 |
| JP | 2003-288986 A | 10/2003 |
| JP | 2004-170943 A | 6/2004 |
| JP | 2005-530200 | 10/2005 |
| KR | 2002-0063524 A | 8/2002 |
| WO | WO-03/058594 | 7/2003 |
| WO | WO-03/107313 | 12/2003 |
| WO | WO-2004/040541 | 5/2004 |

OTHER PUBLICATIONS

Office Action (Application No. 2005-7007546) Dated Apr. 26, 2010.
Search Report (Application No. 03756730.2) Dated Sep. 21, 2009.
International Search Report (Application No. PCT/JP2003/013434) Dated Dec. 9, 2003.
European Search Report (Application No. 11195858.3) Dated Feb. 22, 2012.
Chinese Office Action (Application No. 201210049045.9) Dated Dec. 2, 2013.

201: Setting driving voltage
202: Emitting light emitting element
203: Changing driving voltage

DISPLAY DEVICE AND CONTROLLING METHOD THEREOF

CROSS-REFERENCE TO RELATED APPLICATIONS

This application is a continuation of U.S. application Ser. No. 13/591,511, filed Aug. 22, 2012, now allowed, which is a continuation of U.S. application Ser. No. 13/193,127, filed Jul. 28, 2011, now U.S. Pat. No. 8,253,660, which is a continuation of U.S. application Ser. No. 12/573,998, filed Oct. 6, 2009, now U.S. Pat. No. 7,999,769, which is a divisional of U.S. application Ser. No. 12/255,235, filed Oct. 21, 2008, now U.S. Pat. No. 7,773,082, which is a continuation of U.S. application Ser. No. 11/675,116, filed Feb. 15, 2007, now U.S. Pat. No. 7,453,453, which is a continuation of U.S. application Ser. No. 10/697,003, filed Oct. 31, 2003, now U.S. Pat. No. 7,180,515, which claims the benefit of a foreign priority application filed in Japan as Serial No. 2002-318974 on Oct. 31, 2002, all of which are incorporated by reference.

BACKGROUND OF THE INVENTION

1. Field of the Invention

The present invention relates to a display device (light emitting device) having a light emitting element, and more particularly such a display device having a display part of current driving method.

2. Description of the Related Art

Digital gradation method (digital driving method) and analog gradation method (analog driving method) can be given as driving method of multi-color expression on a display device having a light emitting element. In the aforementioned digital gradation method, a light emitting element is driven in binary of ON (brightness is almost 100%) and OFF (brightness is almost 0%) to obtain gradation by controlling the luminous region and the length of the period during which each pixel emits light. In the analog gradation method, analog input data is written into a light emitting element to modulate the gradation in an analog manner.

Furthermore, expression of gradation is made through two methods, which are a constant voltage drive which is dependent on the voltage applied to the light emitting element, and a constant current drive which is dependent on the current applied to the light emitting element. An electric current flowing through a light emitting element is controlled by a transistor (hereinafter referred to as driver transistor) in current drive.

Operation of a driver transistor is explained referring to the V-I feature shown in FIG. 8. There are two operating regions of the driver transistor, namely, a saturation region and a linear region.

Linear region is a region of which current value changes according to the voltage between the source and drain ($V_{ds}$) and the voltage between the gate and source ($V_{gs}$)·($|V_{ds}|<|V_{gs}-V_{Th}|$) In the linear region, the following expression (1) is established. Note that $I_{ds}$ is the amount of current running through a channel forming region. Note also that $\beta = \mu C_o \cdot W/L$ is established and $\mu$ thereof is a mobility of the driver transistor, $C_o$ is a gate capacity per unit volume, and W/L is a ratio of the channel width W to the length L in channel forming region.

$$I_{ds} = \beta\{(V_{gs}-V_{Th})V_{ds} - \tfrac{1}{2} \cdot V_{ds}^2\} \quad (1)$$

According to the expression (1) above, $V_{ds}$ and $V_{gs}$ obtain the current value in the linear region. In the linear region, the lesser $V_{ds}$ becomes, the lesser current value becomes too, while the current value hardly increases even if $V_{gs}$ gets larger.

When the driver transistor is operated in mainly the linear region, the amount of current flowing between both electrodes of the light emitting element is changed according to both values of $V_{gs}$ and $V_{ds}$. The driver transistor is used as a switch, and a power source line and the light emitting element are shorted if necessary, thereby flowing a current into the light emitting element. The current value flowing through the light emitting element is directly influenced by the characteristics (variation and deterioration in the manufacturing process) of the light emitting element that is connected to the driver transistor.

In the saturation region, the current value is not changed by the voltage between the source and drain ($V_{ds}$), in other words, it is only changed by the voltage between the gate and source ($V_{gs}$)·($|V_{ds}|>|V_{gs}-V_{Th}|$)

In the saturation region, the following expression (2) is established.

$$I_{ds} = \beta(V_{gs}-V_{Th})^2 \quad (2)$$

As set forth in the expression (2), the current value in the saturation region is greatly dependent on a change in $V_{gs}$ but not dependent on a change in $V_{ds}$. Therefore, the current value in the saturation region is not influenced by the characteristics of the light emitting element connected to the driver transistor.

On the other hand, when the driver transistor is operated in mainly the saturation region, the amount of current flowing between both electrodes of the light emitting element is greatly dependent on a change in $V_{gs}$ of the driver transistor but not dependent on a change in $V_{ds}$. A gate voltage of the driver transistor is controlled to flow the necessary amount of current into the light emitting element. In other words, the driver transistor is used as a voltage control current source and the driver transistor is set such that a constant current flows between a power source line and the light emitting element.

In the constant current drive utilizing the abovementioned feature, the current value is not dependent on a change in $V_{ds}$ when the driver transistor is operated in the saturation region. Therefore, the amount of current flowing into the light emitting element can be constant regardless of the characteristics (variation in the manufacturing process, deterioration, and temperature variation) of the light emitting element.

When $V_{gs}$ of a driver transistor is changed appropriately, the driver transistor can be operated in mainly a linear region or in mainly a saturation region.

Operating a driver transistor in the saturation region as shown above is disclosed in patent document 1.

[Patent Document]

Japanese Patent Laid-Open No. Hei 14-108285

In the abovementioned constant current drive, an operating region of a transistor steps into the linear region once $V_{ds}$ thereof is decreased to a certain point by the deterioration of an light emitting element. To avoid this, a setting voltage of $V_{ds}$ ($V_{ds}$ of a driver transistor in operation) is set with an estimated deterioration (voltage for deterioration, voltage α) of the light emitting element. The voltage α is dependent on the deterioration of the light emitting element.

In a conventional setting voltage, in short, $V_{ds}$ needed to be set high because of the estimated value (812) for the margin of the change in characteristics of a light emitting element between before (810) and after (811) deterioration. ($|V_{ds}| \geq |V_{gs}-V_{Th}+\alpha|$)

The voltage applied to the cathode and anode of a light emitting element thus became inevitably high, causing heat generation and high power consumption.

It is an object of the invention to provide a pixel structure which can be operated without adding the voltage α to the setting voltage for the deterioration of the light emitting element. Namely, a pixel structure with the setting voltage in the vicinity of the boundary between the saturation region and the linear region (813 in FIG. 8) is to be provided. A further object of the invention is to provide a display device provided with an aforementioned pixel and a control method thereof.

SUMMARY OF THE INVENTION

The present invention has been made in view of the above problems, and has an object thereof to modify a setting voltage by providing a power source voltage controller which feedbacks the change in current value in accordance with the deterioration of the light emitting element and sets the setting voltage thereby. Therefore, the setting voltage in the vicinity of the boundary between the saturation region and the linear region is to be provided, without the margin of voltage α for the deterioration particularly in the initial setting voltage.

To put it concretely, the invention utilizes an element to check the deterioration of a light emitting element (hereinafter referred to as a monitoring element) and controls the power source voltage in accordance with the deterioration of the monitoring element. That is, voltage between the source and drain is modified to a constant value by fixing the potentials of a gate electrode and source electrode of the driver transistor of the monitoring element and controlling the potential of a drain electrode (drain terminal) in accordance with the deterioration of the light emitting element.

FIG. 1 is a pattern diagram of the structure of the invention, showing a pixel portion 103 having a monitoring element 101 and a pixel 102. The monitoring element 101 has a light emitting element and a driver transistor connected to the pixel. The pixel 102 also has a light emitting element and a driver transistor connected to the pixel. The invention has a first electrode 104 and a second electrode 105 connected to the monitoring element 101 and the pixel 102. A potential of the first electrode is shown as $V_1$, and a potential of the second electrode is shown as $V_2$. Note that a monitoring element may be set up at any part including outside of the pixel portion.

Furthermore, the invention has a power source voltage controller 106 so as to keep the current value constant by recognizing the change in current value in accordance with the deterioration of a monitoring element. Namely, the change in current value with the deterioration of the monitoring element 101 is fed back to the power source voltage of the pixel, fixing the potential of the first electrode: $V_1$, and changing the potential of the second electrode: $V_2$. As the second electrode 105 is connected to the monitoring element 101 and the pixel 102, current value of the pixel 102 is kept constant by changing $V_2$.

Concerning FIG. 1, a layout of the pixel and monitoring element and the structure of the elements are to be identical, while connections (with or without connections) may vary. Concerning the invention, however, the structures of the pixel and the monitoring element do not necessarily have to be identical. However, in the case of forming the monitoring element with the identical structures and different connections, manufacture thereof can be easier as there is no need to change the process but only the design of contacts and the like need to be changed.

Operation to control the power source voltage is now explained with reference to the flow chart, FIG. 2.

First, voltage to apply to the light emitting elements of the monitoring element and a pixel is set (driving voltage of light emitting elements). At this time, the driver transistor is set to operate in the saturation region, but the deterioration margin (voltage α) is not necessarily needed. That is, the voltage α which was conventionally necessary can be unnecessary or reduced according to the invention.

After that, a signal is inputted to the monitoring element and the light emitting element of the pixel to emit light. The gradation expression method to express multicolor at pixels may be either time gradation method or analog gradation method.

The light emitting element of the pixel as well as of the monitoring element deteriorate gradually as time passes. As the light emitting elements of the pixels at this time are expressing gradations, few of them emit light constantly. On the other hand, a light emitting elements of the monitoring elements are controlled to emit light at all time. That is, the light emitting element of the monitoring element deteriorates the fastest. Taking that into account, the power source voltage is controlled to set the setting voltage in accordance with the deterioration of the light emitting element of the monitoring element. In this way, the setting voltage can be modified in consideration of the deterioration of the light emitting element of the pixels.

Deterioration of the light emitting element of the monitoring element raises the resistance value of the light emitting element, lowers $I_{ds}$ of the driver transistor, and reduces $V_{ds}$ of the driver transistor. At this time, the setting voltage is to be adjusted by a power source voltage controller to bring the current value to the setting current. That is, $V_2$ is to be reduced and the voltage applied to the light emitting element is to be raised. Furthermore, the monitoring element and the pixel have the same $V_2$, so that the setting voltage of the pixel is modified simultaneously.

It is to be noted that in the invention, the power source voltage may be controlled by recognizing the change in voltage value or the characteristics in accordance with the deterioration of the monitoring element. The power source voltage may also be controlled by the other changes besides the changes in voltage value and current value in accordance with the deterioration of the monitoring element.

As described above, the invention enables the driver transistor to operate in the saturation region without adding the deterioration margin (voltage α) to the setting voltage when the light emitting element starts emitting light. Therefore, the margin of the setting voltage due to the deterioration of the light emitting element is not needed anymore. In general, the voltage α for the deterioration margin is estimated at 2 to 6V, which causes the driving voltage to decrease as much. As a result, heat generation and high power consumption at pixels can be avoided. As heat generation of the driver transistor can be reduced particularly, the deterioration of the light emitting element can be reduced.

DESCRIPTION OF THE PREFERRED EMBODIMENTS

Preferred embodiments of the invention will be hereinafter described referring to the accompanying drawings. Note that an active element has a gate, a source and a drain, but it is impossible to distinguish a source electrode and a drain electrode because of the element structures. Therefore, when a connection between the terminals is explained, either of the source electrode or the drain electrode is referred to as a first electrode, and the other is referred to as a second electrode for convenience.

[Embodiment Mode 1]

Hereinafter explained with reference to FIG. 3 is an example in which an operational amplifier is used as a power source voltage controller. Note that in this embodiment mode, a p-channel type driver transistor is applied, but an n-channel type driver transistor can be applied instead. Meanwhile, as an example of the invention, an anode potential of a pixel 311 ($V_{anode}$) is referred to as $V_1$, and cathode potentials of the pixel 311 and of a monitoring element 301 ($V_{cathode}$) are referred to as $V_2$.

Figure 1:
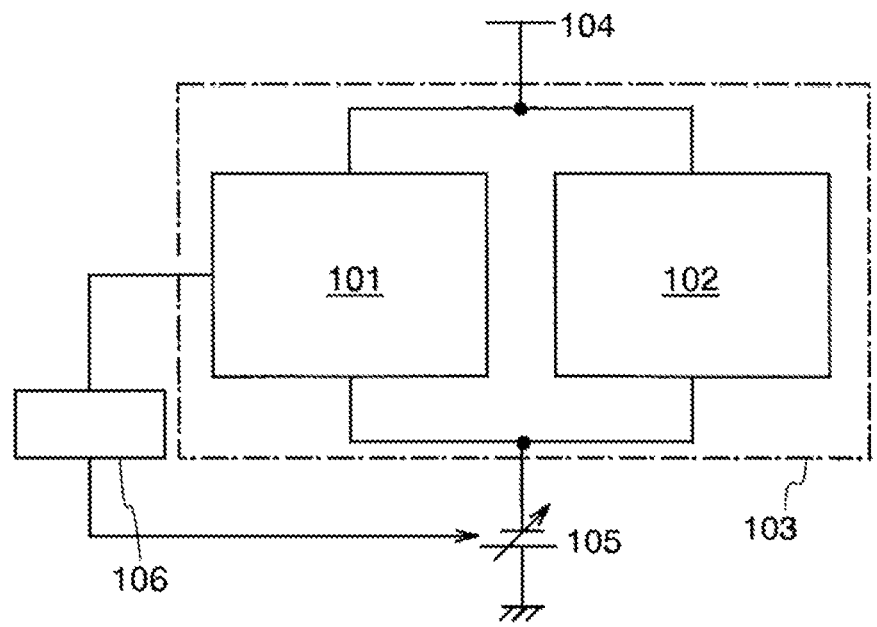
FIG. 1 is a pattern diagram of a pixel portion of the invention.
Figure 2:
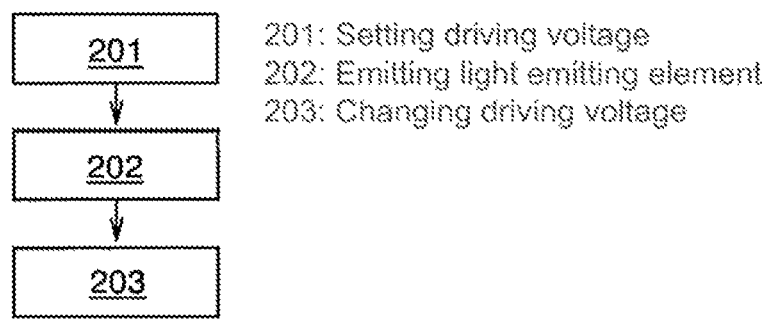
FIG. 2 is a flow chart showing an operation of a display device of the invention.
Figure 3A:
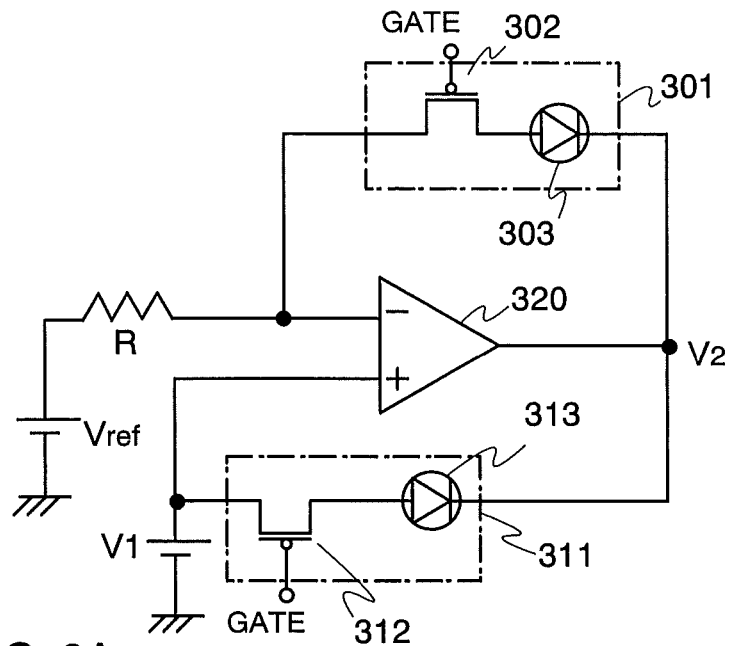
FIGS. 3A and 3B are pattern diagrams of a pixel portion of a display device of the invention.

FIG. 3A shows an equivalent circuit diagram of a pixel structure of the invention. A monitoring element 301 has a driver transistor 302 and a light emitting element 303 which is connected to a second electrode of the driver transistor 302. A pixel 311 has a driver transistor 312 and a light emitting element 313 which is connected to a second electrode of the driver transistor 312. The light emitting elements 303 and 313 are connected to an output terminal of the operational amplifier 320 and have a voltage of $V_2$. Meanwhile, first electrodes of the driver transistors 302 and 312 have potential $V_1$ which is the same potential as the electrodes of the light emitting elements.

A non-inverted input terminal (+ side) of the operational amplifier 320 is connected to the first electrode of the driver transistor 312 of the pixel, and an inverted input terminal (− side) is connected to the first electrode of the driver transistor 302 of the monitoring element. The driver transistor of the monitoring element is connected to a reference power source ($V_{ref}$) via a resistance (R). Note that $V_{ref}$ is higher than $V_1$ ($V_{anode}$).

Next, a method for setting a voltage of the driver transistor of the monitoring element ($V_{ds}$) is explained.

First, $V_1$ (namely, $V_{anode}$ of the monitoring element) is set on the basis of a specification of a display device. Specifications of general display devices prescribe $V_1$ as 2 to 6V. A gate voltage of the driver transistor 302 ($V_{moni}$) is set so that a predetermined current ($I_{ref}$) can flow in the monitoring element in a saturation region. Then, a gate voltage of the driver transistor 312 ($V_{pix}$) is set at the same value or higher than $V_{moni}$.

Figure 3B:
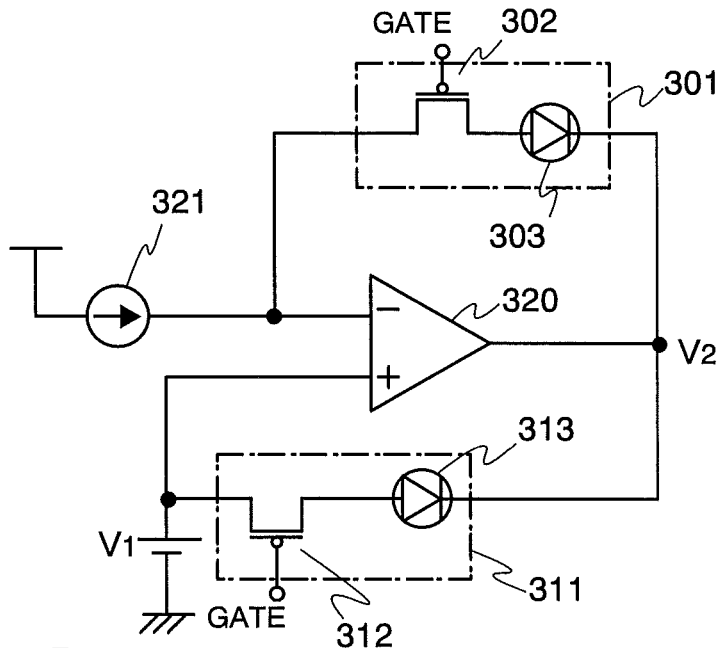

Next, the reference power source $V_{ref}$ and the resistance value R are set so that the predetermined current ($I_{ref}$) can flow in the monitoring element 301 and the driver transistor 302 can operate in a saturation region. Note that other means to supply a predetermined current which flows in the monitoring element can be used besides the reference power source $V_{ref}$ and the resistance R. For example, the predetermined current ($I_{ref}$) can be supplied by a current source 321 as shown in FIG. 3B.

Namely, the values of $V_1$, $V_{ref}$, $V_{moni}$, $V_{pix}$ and R are determined by a practitioner and $I_{ds}$ of the driver transistor 302 of the monitoring element is controlled externally.

As described above, a display operation is started by setting the monitoring element (called an operation state or a driving state). After that, the light emitting element 303 of the monitoring element deteriorates as time passes. Similarly, the light emitting element 313 of the pixel deteriorates. Further, due to the deterioration of the light emitting element, the resistance value becomes high, thus a current value flowing in the monitoring element becomes low.

The operational amplifier will be hereinafter explained. The operational amplifier 320 basically functions with an input potential of approximately 0 and with a non-inverted input terminal and an inverted input terminal, the voltages of which are approximately the same. Accordingly, the following expression is established.

$$I_{ref}=(V_{ref}-V_1)/R=(V_1-V_2)/R_{moni}$$

$$\therefore V_2=(R_{moni}/R+1)\cdot V_1-(R_{moni}/R)\cdot V_{ref}$$

$R_{moni}$ is a resistance value between the first electrode of the driver transistor 302 and the power source side of the light emitting element 303. The operational amplifier changes the value of $V_2$ when $R_{moni}$ is changed and keeps the $I_{ref}$ value constant.

Such an operational amplifier modifies a setting voltage and further modifies $V_{ds}$ of the driver transistor of the pixel because the monitoring element and the pixel has $V_2$ ($V_{cathode}$) in common.

Meanwhile, in this embodiment mode, $V_{ds}$ is set in a saturation region even when electric characteristics of the driver transistor are changed by the temperature or the like because $I_{ds}$ is determined and controlled by the operational amplifier.

Hereinafter, the setting current of the monitoring element will be complimented in view of the difference of the deteriorating speeds between the pixel and the light emitting element.

In the case of a digital gradation method for example, the light emitting element of the pixel repeatedly performs the light emission and non-light emission (erasure) on the basis of a signal current (video signal). Meanwhile, the light emitting element of the monitoring element constantly emits light. Therefore, the light emitting element of the monitoring element deteriorates faster than that of the pixel. That means the deterioration of the light emitting element of the monitoring element is the fastest of all.

Namely, a voltage with an estimated deterioration of the light emitting element can be set in the driver transistor of every pixel when $V_{ds}$ of the driver transistor is set by the operational amplifier so that the deterioration of the light emitting element of the most deteriorated monitoring element can be offset. Therefore, it is not required to control the light emitting element of the monitoring element corresponding to the light emission and non-light emission of the light emitting element of the pixel.

However, preferably required is the case where a light emission ratio of the light emitting element of the pixel per frame (duty ratio) is figured, and the light emitting element of the monitoring element are made to emit light in accordance with the duty ratio. Namely, in the case of the digital gradation system, the setting current of the monitoring element is preferably set at (current value during the light emission×duty ratio).

In the case of an analog gradation method, the gradation is controlled by the amount of the current which flows into the light emitting element as described above. Therefore, in the analog gradation system, a current value over the average of the pixel with the maximum light emission is preferably required.

That is to say, according to the invention, it is possible to obtain a setting voltage with an estimated deterioration of the light emitting elements of all the pixels by measuring the deterioration of the monitoring elements and setting the setting voltage of the monitoring elements in the saturation region.

Further, the deterioration ratio of the light emitting elements is different depending on the materials: red (R), green (G) and blue (B). In this case, by taking the deterioration of the light emitting elements of the monitoring elements equal to or more than the most deteriorated element of each light emitting element, $V_2$ ($V_{cathode}$) can have a sufficient value.

As above, according to the invention, it is possible to obtain a setting voltage without a deterioration margin (voltage a). Accordingly, a margin of the setting voltage in accordance with a deterioration of a light emitting element is not required, thus heat generation and power consumption can be reduced. Particularly, by the reduction in power consumption of the driver transistor, the deterioration of the light emitting element can be prevented.

[Embodiment Mode 2]

Figure 4:
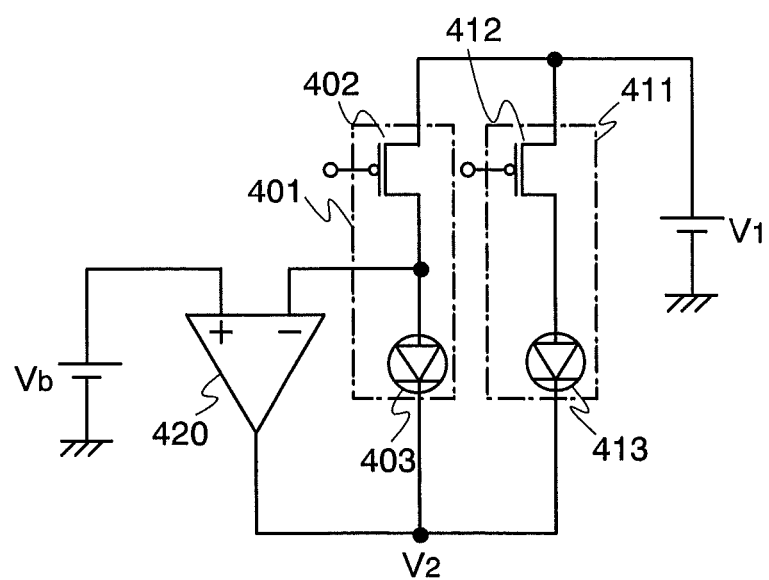
FIG. 4 is a pattern diagram of a pixel portion of a display device of the invention.

Hereinafter explained with reference to FIG. 4 is a different pixel structure from that of Embodiment Mode 1. Note that in this embodiment mode, a driver transistor is a p-channel type, an anode potential of a light emitting element ($V_{anode}$) is referred to as $V_1$, and a cathode potential of the light emitting element ($V_{cathode}$) is referred to as $V_2$.

An equivalent circuit diagram of a pixel structure is shown in FIG. 4. As well as Embodiment Mode 1, a monitoring element 401 has a driver transistor 402 and a light emitting element 403 which is connected to a second electrode of the driver transistor 402. A pixel 411 has a driver transistor 412 and a light emitting element 413 which is connected to a second electrode of the driver transistor 412. The light emitting elements 403 and 413 are connected to an output terminal of the operational amplifier 420 and have a voltage of $V_2$. Meanwhile, first electrodes of the driver transistors 402 and 412 have potential $V_1$ which is the same potential as the electrodes of the light emitting elements.

Unlike Embodiment Mode 1, a non-inverted input terminal (+ side) of the operational amplifier 420 is connected to a bias power source $V_b$, and an inverted input terminal (− side) is connected to the interconnection between the driver transistor of the monitoring element 402 and the light emitting element 403.

Next, a method for setting a voltage of the driver transistor of the monitoring element ($V_{ds}$) is explained.

First, $V_1$ is set on the basis of a specification of a display device. Then, a gate voltage of the driver transistor 402 ($V_{moni}$) is set so that a predetermined current ($I_{ref}$) can flow in the monitoring element in a saturation region. Also, a gate voltage of the driver transistor 412 ($V_{pix}$) is set at the same value as or higher than $V_{moni}$.

Next, $V_b$ is determined so that the driver transistor 402 of the monitoring element can operate in a saturation region. Namely, $V_{ds}$ of the driver transistor is determined. As described above, a current which flows in the monitoring element 401 is determined by the operational amplifier and $V_2$ ($V_{cathode}$) is determined so that the current which flows in the monitoring element 401 can flow in the light emitting element 403.

Namely, the values of $V_1$ and $V_b$ are determined externally and $V_{ds}$ of the driver transistor of the monitoring element is controlled.

When a display operation is started by setting as above, a resistance value rises due to the deterioration of the light emitting element. Then, with the current value flowing in the monitoring element lowered, $V_{ds}$ of the driver transistor 402 also tries to lower itself. However, $V_{ds}$ is held constant because the potential difference between the input terminals of the operational amplifier is ideally 0. Then, $I_{ds}$ becomes constant because $V_{gs}$ and $V_{ds}$ are constant, thus $V_2$ is automatically selected by $I_{ds}$.

The monitoring element and the pixel has $V_2$ ($V_{cathode}$) in common. That means $V_{ds}$ of the driver transistor of the pixel is set as well.

In this manner, this embodiment mode is characterized by determining $V_{ds}$. Further, this embodiment mode in which $V_{ds}$ is directly controlled provides a simpler method for setting a voltage as compared to Embodiment Mode 1 in which $I_{ds}$ is determined.

As described above, according to the invention, it is possible to obtain a setting voltage without a deterioration margin (voltage a) from the time the light emitting element starts emitting light. Therefore, a margin of the setting voltage in accordance with a deterioration of the light emitting element is not required, thus heat generation and power consumption can be reduced. Particularly, by the reduction in heat generation of the driver transistor, the deterioration of the light emitting element can be prevented.

[Embodiment Mode 3]

Hereinafter explained is a different pixel structure from those of Embodiment Mode 1 and Embodiment Mode 2.

Figure 10:
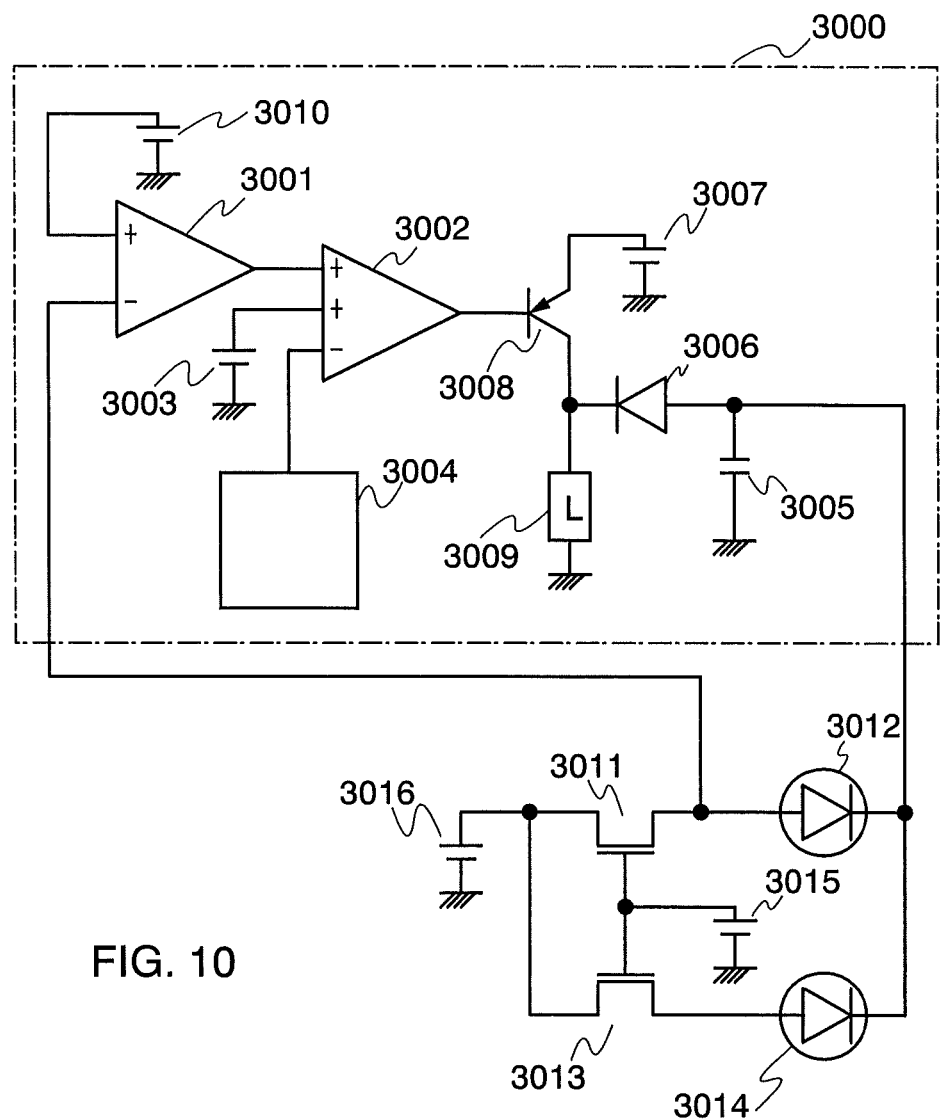
FIG. 10 is a pattern diagram of a pixel portion of a display device of the invention.

FIG. 10 shows a circuit diagram as described in Embodiment Mode 2, wherein a switching regulator 3000 is applied in stead of an operational amplifier as a power source voltage controller. For a constitution where an operational amplifier is applied, a power source circuit for the operational amplifier is required. This embodiment mode makes it possible to unite an operational amplifier and the power source circuit by using a switching regulator.

A pixel structure which has a switching regulator will be hereinafter described. In FIG. 10, the switching regulator 3000 is comprised of an error amplifier 3001, a PWN comparator 3002, a reference power sources 3003 and 3010, an oscillation circuit 3004, a switching transistor 3008, an inductor 3009, a diode 3006, a smoothing capacitor 3005 and a battery 3007. As well as Embodiment Mode 2, a monitoring element has a driver transistor 3011 and a light emitting element 3012 which is connected to a first electrode of the driver transistor 3011. A pixel has a driver transistor 3013 and a light emitting element 3014 which is connected to a first electrode of the driver transistor 3013. Gate electrodes of the driver transistors 3011 and 3013 are connected to a power source 3015 and second electrodes of the transistors 3011 and 3013 are connected to a power source 3016.

Next, an operation of the switching regulator will be explained. At the start of operating, a potential of the smoothing capacitor 3005 which is an output of the switching regulator is 0. The potential of the smoothing capacitor is inputted to an inverted input terminal of the error amplifier 3001, and a potential of the light emitting element is inputted to a non-inverted input terminal. A current of the transistor 3011 flows in the light emitting element 3012 and a voltage is generated in the light emitting element. When the voltage is higher than that of the reference power source 3010, the error amplifier 3001 operates so as to lower the output. Then, the PWN comparator 3002 operates so as to lower the voltage of the inductor 3009 by changing the duty of the oscillation. Therefore, a potential of the smoothing capacitor 3005 is lowered and an anode potential of the light emitting element 3012 is also lowered to become approximately the same potential as the power source 3010. Meanwhile, when an anode potential of the light emitting element 3012 is lower than that of the reference power source 3010, the opposite operation is taken, and the anode potential rises to the same potential as the reference power source 3010.

In this manner, the same effect as that of an operational amplifier can be obtained by using the switching regulator 3000. Also, a power source can be reduced.

[Embodiment Mode 4]

Figure 5:
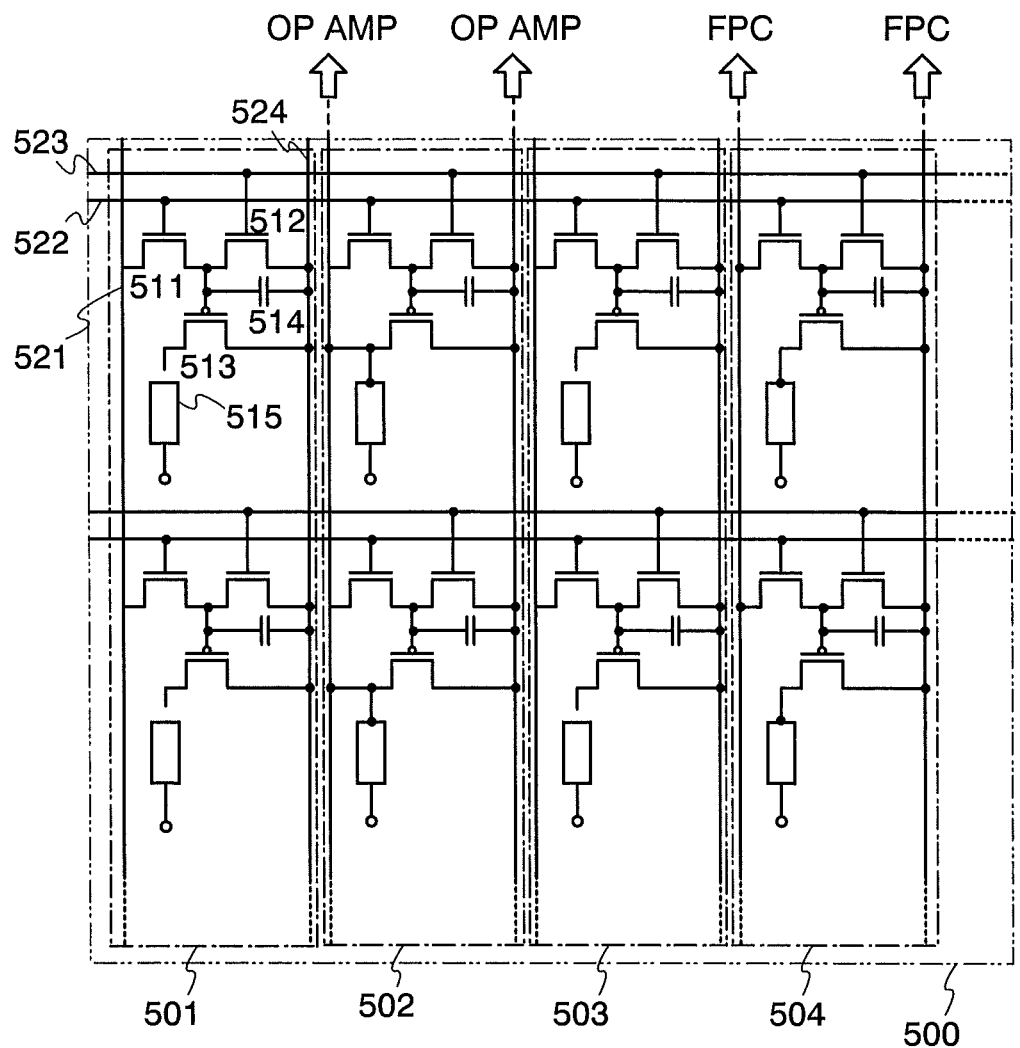
FIG. 5 is an equivalent circuit diagram of a pixel portion of a display device of the invention.
Figure 6:
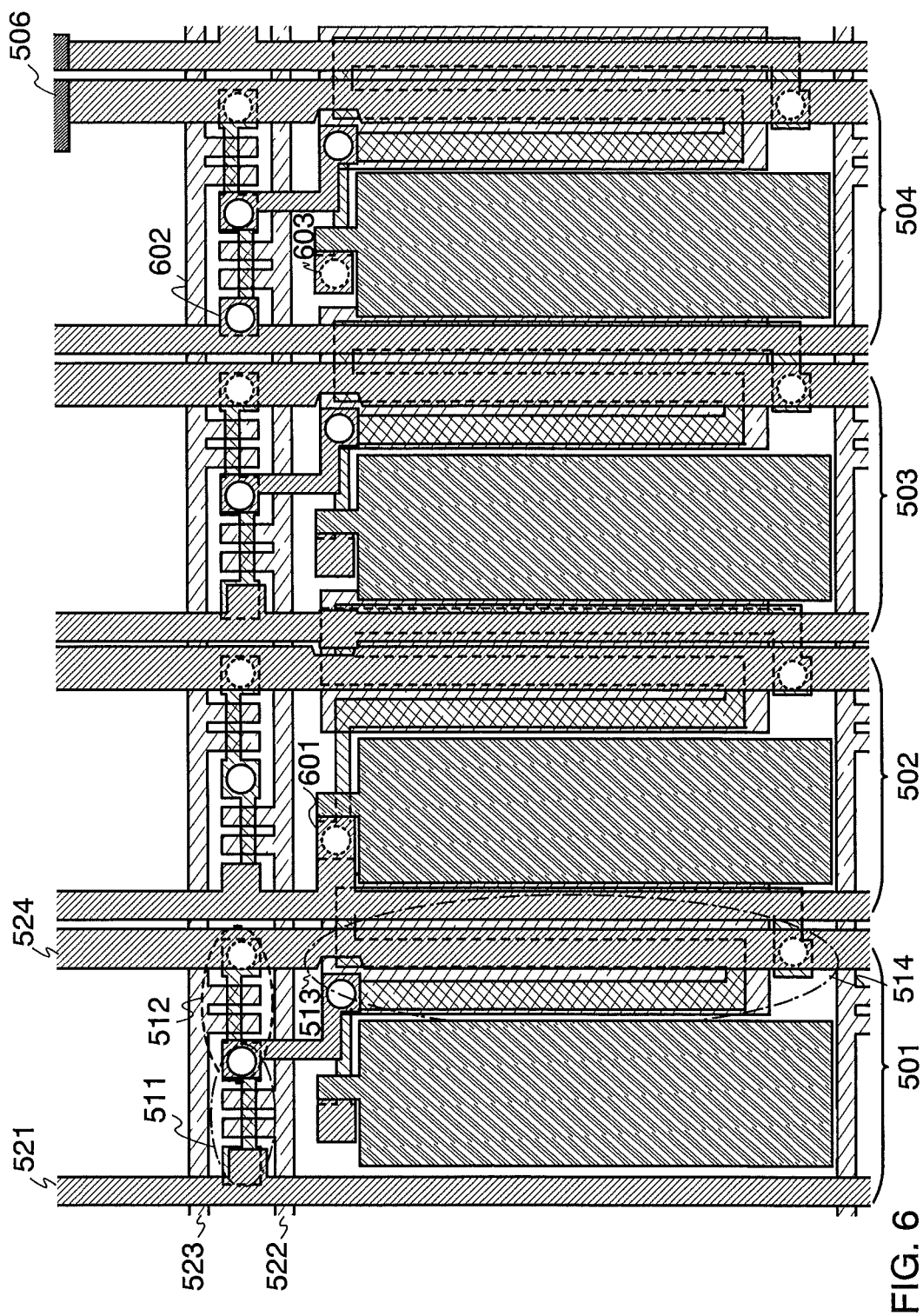
FIG. 6 is a top plan view of a pixel portion of a display device of the invention.

Hereinafter explained with reference to FIGS. 5 and 6 is the pixel portion having a monitoring element. Note that a thin film transistor (hereinafter referred to as TFT) formed over an insulating surface is employed as a transistor of an active element in this embodiment mode.

Shown in FIG. 5 is an equivalent circuit diagram of a pixel portion 500 having a first dummy pixel 501, a monitoring element 502, a second dummy pixel 503 and a pixel 504 in this order. The first and second dummy pixels are provided so that the whole pixel portion is under the equal condition including the pixels at the edge as well as the pixels around them.

The dummy pixel, the monitoring element and the pixel have similar structures, having a first TFT (selector TFT) 511, a second TFT (erasure TFT) 512, a third TFT (driver TFT) 513, a capacitor element 514, and a light emitting element 515 at the crossed part of a signal line 521 and a first scanning line 522. Note that the selector TFT and the erasure TFT are formed by using n-channel type TFTs, and the driver TFT is formed by using a p-channel type TFT in this embodiment mode. Also, a second scanning line 523 which is connected to a gate electrode of the erasure TFT, and a current supply line 524 which is connected to a first electrode of the erasure TFT and a first electrode of the driver TFT are provided.

The dummy pixel, the monitoring element and the pixel, however, vary in connections of each structure. First and second dummy pixels are not connected to the first electrode of the selector TFT 511 and the signal line 521. Secondly, the first electrode of the driver TFT 513 is not connected to the first electrode of the light emitting element 515. These dummy pixels are provided in order to operate the whole pixels under the same condition including the pixels at the edge as well as the pixels around them. Therefore, dummy pixels neither need to emit light, write data from the signal line to pixels, nor make the light emitting element emit light. In the invention, however, the dummy pixel may emit light. The signal line 521 of the dummy pixel and the current supply line 524 are connected to each other to have the same potentials.

In the monitoring element, the first electrode of the selector TFT 511 is not connected to the signal line 521. The signal line 521, however, is connected to the first electrode of the light emitting element 515. This is intended to make the monitoring element emit light constantly so that the deterioration thereof proceeds fast. Therefore, voltage applied from the signal line as information for brightness does not have to go through the selector TFT 511 to be inputted to the light emitting element. The signal line 521 and the current supply line 524 of the monitor element are connected to an operational amplifier respectively.

In the pixel, the first electrode of the selector TFT 511 is connected to the signal line 521, and a first electrode of the driver TFT 513 is connected to the first electrode of the light emitting element 515. It is intended that in the pixel, the light emitting element 515 emits light through the driver TFT 513 based on the signal voltage from the signal line. Furthermore, the signal line 521 and the current supply line 524 of the pixel are connected to the driver circuit and an FPC respectively.

In FIG. 6, a top plan view of a part of the pixel portion shown in FIG. 5 is shown. The first dummy pixel 501, the monitoring element 502, the second dummy pixel 503, and the pixel 504 of the first line are shown. These dummy pixels, monitoring elements and pixels have the selector TFT 511, the erasure TFT 512, the driver TFT 513, and the light emitting element 515 (only the first electrode thereof is shown) at the crossed parts of the signal line 521, the current supply line 524, the first scanning line 522, and the second scanning line 523. A capacitor element 514 (configured with a gate metal and a semiconductor film of the TFT 513) is provided as needed. Note that, another capacitor element is added when the gate capacitor of the driver TFT is too small for the leakage current of the TFT.

As described above with reference to FIG. 5, these dummy pixels, the monitoring element, and the pixel have the identical structures, however, the presence of contacts differs. That is, what differs in the dummy pixels, the monitoring element, and the pixel is whether the connection between the selector TFT 511 and the signal line 521 and the connection between the driver TFT 513 and the light emitting element 515 exist or not.

In the first and second dummy pixels, there are no contacts in the contact portion of the selector TFT 511 and the signal line 521, and in the contact portion of the driver TFT 513 and the first electrode of the light emitting element 515. The monitoring element, however, is provided with a contact 601 with the signal line 521 in the contact portion of the driver TFT 513 and the light emitting element 515, although there is no contact in the contact portion of the selector TFT 511 and the signal line 521. In the pixel, there is a contact 602 in the contact portion of the selector TFT 511 and the signal line 521, and a contact 603 in the contact portion of the driver TFT 513 and the light emitting element 515.

Furthermore, a leading wiring is provided so that the signal line and the current supply line of the monitoring element are connected to the operational amplifier. Moreover, the signal line and the current supply line of the pixel are connected to an FPC terminal 506 or a driver circuit respectively. The signal line and the current supply line of the dummy pixel are connected to each other and have the same potentials.

The monitoring element is not necessarily required in a whole line, but has only to be provided one. It depends on the performance of the operational amplifier to which the monitoring element is connected. The monitoring elements may be provided in plural, and also can be disposed symmetrically to the pixel portion. The monitoring element may be disposed in any forms.

A line of monitoring elements are connected to each other in parallel through the current supply line, and a plurality of monitoring elements can be seen as one big monitoring element.

In this manner, the monitoring element of the invention can be formed by changing the layout design of the element, without changing the process of the pixel. Also, the setting voltage of the pixel can be at the best voltage in the saturation region at all times by utilizing the monitoring element formed thereby. Therefore, heat generation and power consumption can be reduced, resulting in the longer life of the light emitting element.

[Embodiment Mode 5]

The pixel portion shown in the above embodiment mode is provided light emitting elements and sealed not to be exposed to the air, thus completing a panel. ICs including an operational amplifier, a controller, and a power source circuit and the like are mounted on the panel, thus completing a display module. The specific structure of the display module is explained here.

Figure 11A:
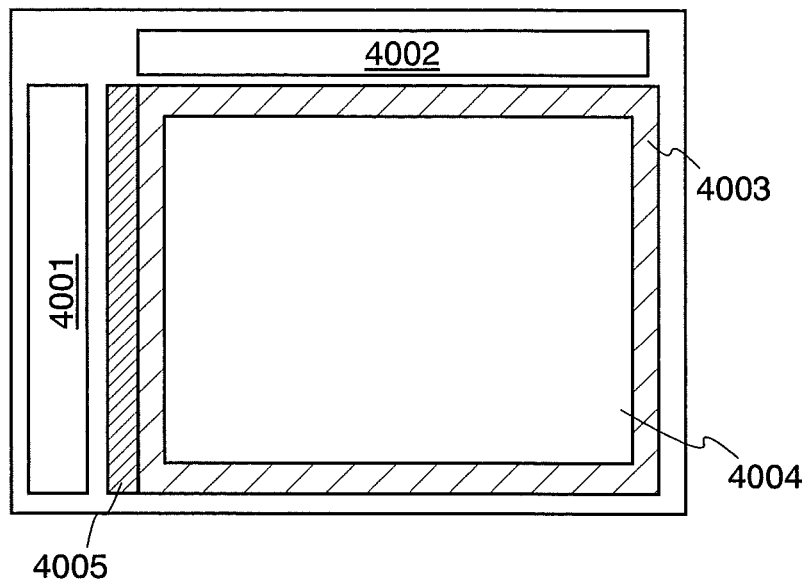
FIGS. 11A and 11B are pattern diagrams of a pixel portion of a display device of the invention.

A pattern diagram provided with a line of monitoring elements 751 near the signal line driver circuit 705 is shown in FIG. 11A. The monitoring element shown in FIG. 11A comprises a signal line driving circuit 4001, a scanning line driving circuit 4002, a plurality of dummy pixels 4003, a plurality of pixels 4004 and a monitoring element 4005. The invention has monochrome light emitting elements when the monitoring elements are provided in one line as shown in FIG. 11A. Therefore, it is desirable to apply it to a display device which expresses RGB with a color converting layer.

Figure 11B:
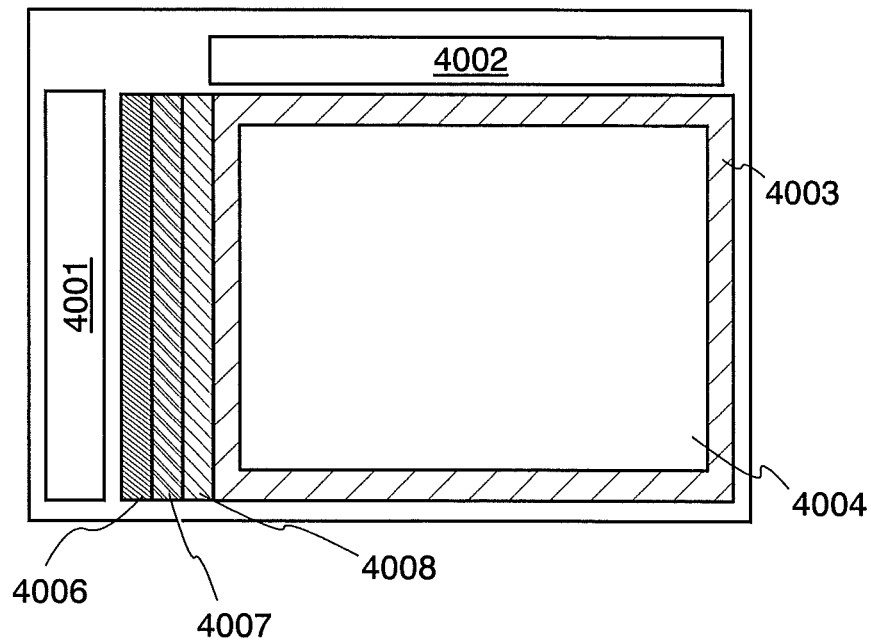

Furthermore, the monitoring elements may be provided in a plurality of lines or at a plurality of portions as shown in FIG. 11B. The monitoring element shown in FIG. 11A comprises a signal line driving circuit 4001, a scanning line driving circuit 4002, a plurality of dummy pixels 4003, a plurality of pixels 4004, a 1st monitoring element (R) 4006, a 1st monitoring element (G) 4007 and a 1st monitoring element (B) 4008. When providing the monitoring elements in a large panel particularly, it is desirable that the monitoring elements be provided in a plurality of lines although it depends on the performance of the operational amplifier. At the same time, first to third monitoring elements had better be provided in consideration of the difference of deteriorations between the materials for each color (RGB) as shown in FIG. 11B. The place to dispose each monitoring element is not exclusively applied to FIG. 11B. It may be disposed at any peripheral region of the pixel, including outside thereof.

Figure 7A:
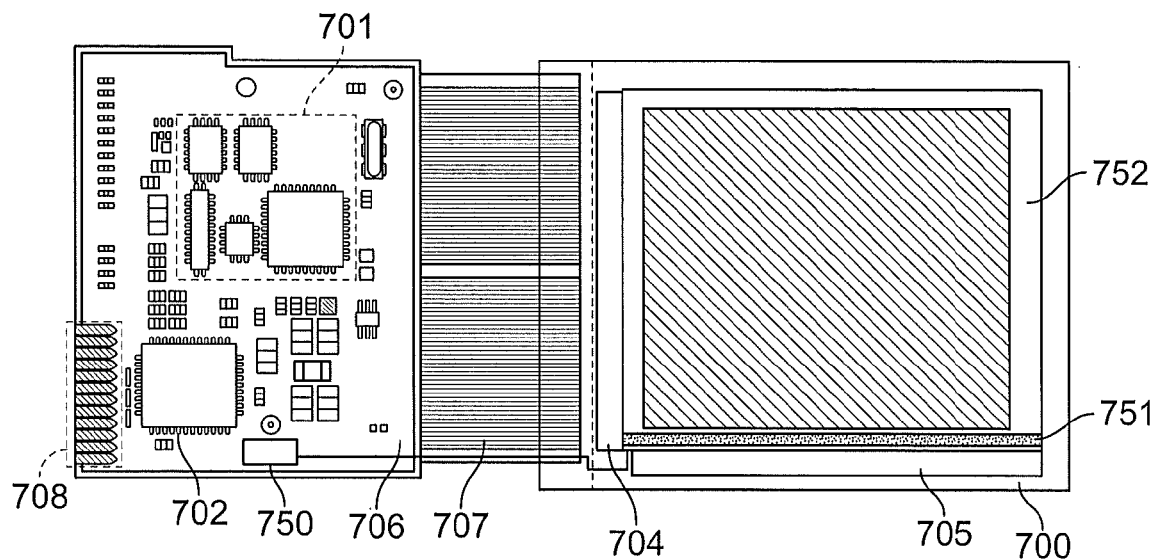
FIGS. 7A and 7B are top plan views of a display module of the invention.

An outline view of the display module of the structure of FIG. 11A is shown in FIG. 7A. The display module is mounting an operational amplifier 750, a controller 701 and a power source circuit 702. A pixel portion 703 in which a light emitting element is formed in each pixel, a monitoring element 751 and a dummy pixel 752 are mounted, a scanning line driver circuit 704 for selecting pixels in the pixel portion 703, and a signal line driver circuit 705 for supplying a video signal to the selected pixels are formed in the panel 700. The monitoring element 751 is disposed near the signal line driver circuit 705 as one side of the pixel portion 703 and connected to the operational amplifier 750. In addition, the dummy pixel 752 is provided around (periphery of) the pixel portion 703 in order to put the pixels at the edge (the most outside pixels. In case of m×n pixels, and a pixel in the first row and the first line, a pixel in the m-th row and the n-th line) under the same condition as the peripheral pixels.

Similarly, the dummy pixel 752 may be disposed at the necessary periphery only although it is disposed around the pixel portion 703 in the figure. Also, the place and number of the signal line driver circuit and the scanning line driver circuit to dispose are not limited to FIG. 7A.

Further, the operational amplifier 750, the controller 701 and the power source circuit 702 are formed over a printed circuit board 706. Each type of signal and a power source voltage outputted from the controller 701 or the power source circuit 702 are supplied through an FPC 707 to the pixel portion 703, the scanning line driver circuit 704, and the signal line driver circuit 705 of the panel 700.

The power source voltage and each type of signal are supplied to the printed circuit board 706 through an interface (I/F) portion 708 on which a plurality of input terminals are disposed.

Note that although the printed circuit board 706 is mounted via an FPC 707 on the panel 700 in this embodiment mode, the structure is not necessarily limited to this. The controller 701 and the power source circuit 702 may also be mounted directly on the panel 700 by using a COG (Chip on Glass) method.

Further, noise may ride on the power source voltage and the signals, and the signal rise time may become slowed, due to capacitance that are formed between leading wirings, resistance of wirings themselves, and the like of the printed circuit board 706. Various types of elements, such as capacitors and buffers, may be formed over the printed circuit board 706 so as to prevent noise from riding on the power source voltage or the signals, and slowness in the signal rise time.

Figure 7B:
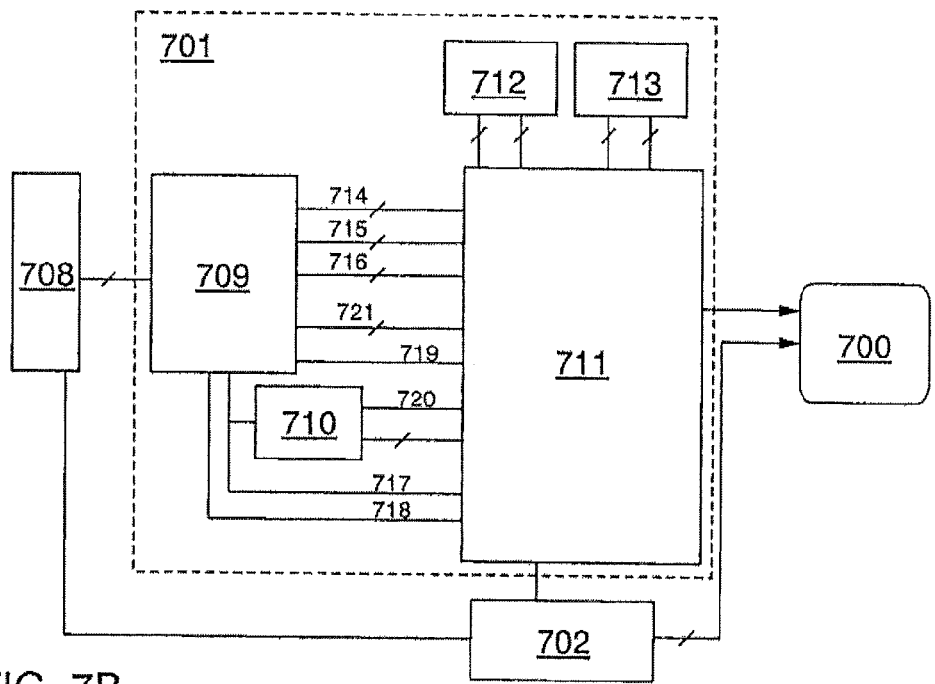
Figure 8:
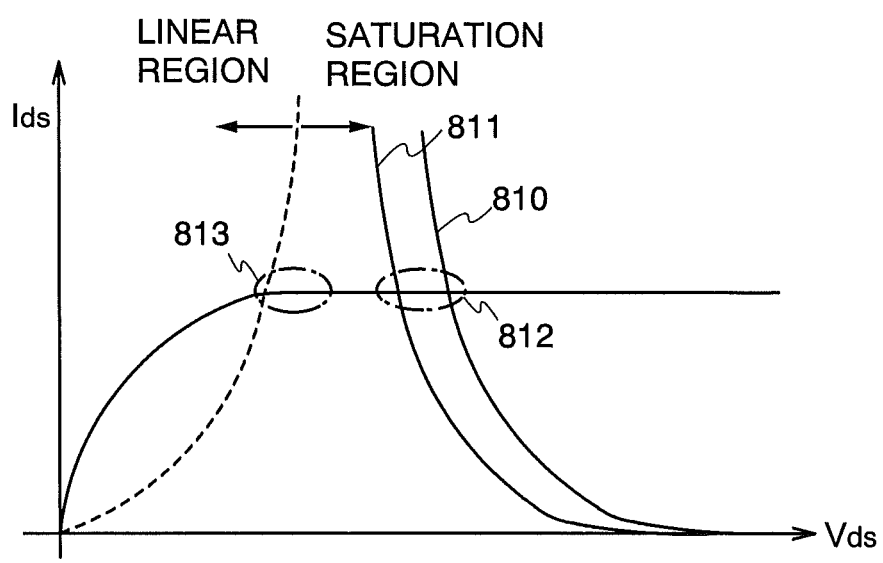
FIG. 8 is a view showing a V-I feature of a transistor.

A block diagram of the structure of the printed circuit board 706 is shown in FIG. 7B. Each type of signal and the power source voltage supplied by the interface 708 are supplied to the controller 701 and the power source circuit 702.

The controller 701 has an A/D converter 709, a phase locked loop (PLL) 710, a control signal generator portion 711, and SRAMs (Static Random Access Memories) 712 and 713. Note that, although SRAMs are used here, it is also possible to use SDRAMs or DRAMs (Dynamic Random Access Memories) as substitutes for the SRAMs, provided that the DRAMs are capable of writing and reading data at a high speed.

A video signal supplied through the interface 708 is subjected to a parallel-serial conversion in the A/D converter 709, and inputted to the control signal generator portion 711 as a video signal corresponding to the colors R, G, and B (R video signal 714, G video signal 715 and B video signal 716). Further, an Hsync signal 717, a Vsync signal 718, a clock signal CLK (CLK1 719 and CLK2 720), and alternating voltage (AC Cont 721) are generated in the A/D converter 709 based on each of the signals supplied through the interface 708, and then inputted to the control signal generator portion 711.

The phase locked loop 710 functions to align the phase of the operating frequency of the control signal generator portion 711 with the frequency of each of the signals supplied through the interface 708. The operating frequency of the control signal generator portion 711 is not necessarily the same as the frequency of each of the signals supplied through the interface 708. The operating frequency of the control signal generator portion 711 is regulated in the phase locked loop 710 so that the frequencies become synchronized.

The video signal inputted to the control signal generator portion 711 is temporarily written into the SRAMs 712 and 713, and stored. A video signal corresponding to all pixels is read out one bit at a time from the video signals of all of the bits that are stored in the SRAM 712, and then supplied to the signal line driver circuit 705 of the panel 700.

The control signal generator portion 711 supplies information, which relates to light emission periods by the light emitting elements for each bit, to the scanning line driver circuit 704 of the panel 700.

The power source circuit 702 supplies a predetermined power source voltage to the signal line driver circuit 705, the scanning line driver circuit 704, and the pixel portion 703 of the panel 700.

The display module formed like this can set the best setting voltage in the saturation region all the time by utilizing the monitoring element. Therefore, heat generation and power consumption can be reduced, resulting in the longer life of the light emitting element.

[Embodiment Mode 6]

Given as examples of electronic apparatuses that employ display devices manufactured in accordance with the invention are video cameras, digital cameras, goggle type displays (head mounted displays), navigation systems, audio playback devices (car audios, audio components, etc.), notebook type personal computers, game machines, portable information terminals (mobile computers, mobile telephones, mobile type game machines, and electronic books, etc.), image reproduction devices equipped with a recording medium (specifically, devices equipped with a display device capable of reproducing the recording medium such as a Digital Versatile Disk (DVD), etc. and displaying the image thereof), and the like. Examples of these electronic apparatuses are shown in FIG. 9.

Figure 9A:
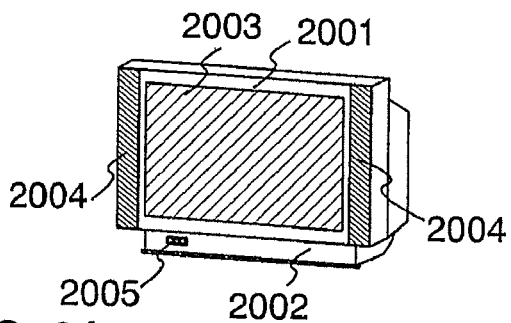
FIGS. 9A to 9H are views showing electronic apparatuses having pixel portions of display devices of the invention.

FIG. 9A is a display device, which is composed of a frame 2001, a support base 2002, a display portion 2003, a speaker portion 2004, a video input terminal 2005, and the like. The pixel portion having a monitoring element of the invention is used for the display portion 2003 to manufacture the display device. Note that in the case of manufacturing a large-sized display device, the monitoring elements are provided in a plurality of rows or more preferably at every RGBs. When the invention is applied to such a display device, particularly to a large-sized display device, the low power consumption is achieved, thus the problems of the heat generation and the deterioration of the light emitting elements can be solved. Note that the term display device includes all display devices for displaying information, such as those for personal computers, those for receiving TV broadcasting, and those for advertising.

Figure 9B:
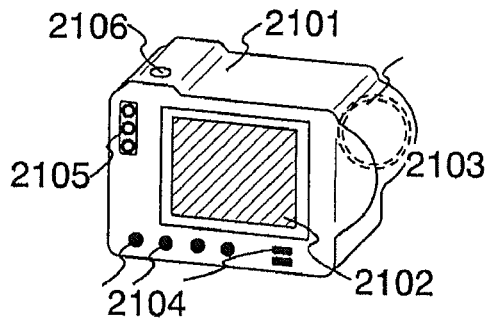

FIG. 9B is a digital still camera, which is composed of a main body 2101, a display portion 2102, an image-receiving portion 2103, operation keys 2104, an external connection port 2105, a shutter 2106, and the like. The pixel portion having a monitoring element of the invention is used for the display portion 2102 to manufacture the digital still camera.

Figure 9C:
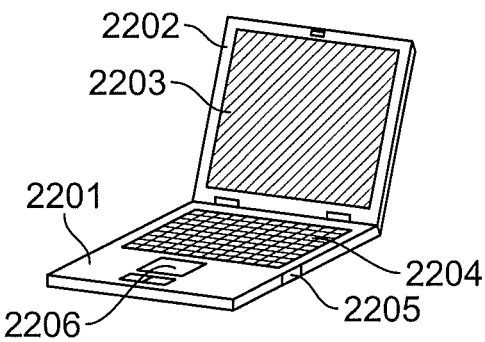

FIG. 9C is a notebook type personal computer, which is composed of a main body 2201, a frame 2202, a display portion 2203, a keyboard 2204, an external connection port 2205, a pointing mouse 2206, and the like. The pixel portion having a monitoring element of the invention is used for the display portion 2203 to manufacture the notebook type personal computer.

Figure 9D:
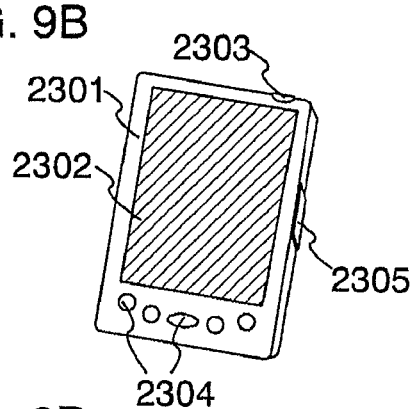

FIG. 9D is a mobile computer, which is composed of a main body 2301, a display portion 2302, a switch 2303, operation keys 2304, an infrared port 2305, and the like. The pixel portion having a monitoring element of the invention is used for the display portion 2302 to manufacture the mobile computer.

Mobile apparatuses such as a notebook type personal computer and a mobile computer which has a pixel portion having a monitoring element of the invention have advantages in that power consumption is reduced and the storage period of a battery is prolonged.

Figure 9E:
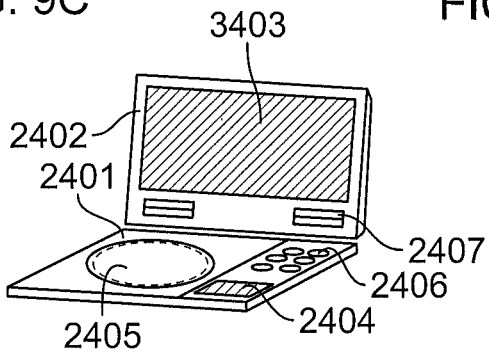

FIG. 9E is a portable image reproduction device provided with a recording medium (specifically, a DVD playback device), which is composed of a main body 2401, a frame 2402, a display portion A 2403, a display portion B 2404, a recording medium (such as a DVD) read-in portion 2405, operation keys 2406, a speaker portion 2407, and the like. The display portion A 2403 mainly displays image information, and the display portion B 2404 mainly displays character information, and the pixel portion having a monitoring element of the invention is used in the display portion A 2403 and in the display portion B 2404 to manufacture the portable image reproduction device. Note that image reproduction devices provided with a recording medium include game machines for domestic use and the like.

Figure 9F:
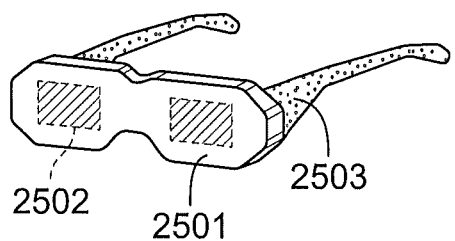

FIG. 9F is a goggle type display (head mounted display) which is composed of a main body 2501, a display portion 2502, an arm 2503. The pixel portion having a monitoring element of the invention is used in the display portion 2502 to manufacture the goggle type display.

Figure 9G:
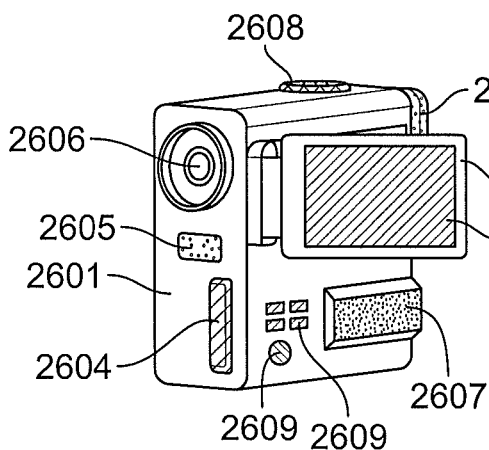

FIG. 9G is a video camera, which is composed of a main body 2601, a display portion 2602, a frame 2603, an external connection port 2604, a remote control receiving portion 2605, an image receiving portion 2606, a battery 2607, an audio input portion 2608, operation keys 2609, an eyepiece portion 2610, and the like. The pixel portion having a monitoring element of the invention is used for the display portion 2602 to manufacture the video camera.

Figure 9H:
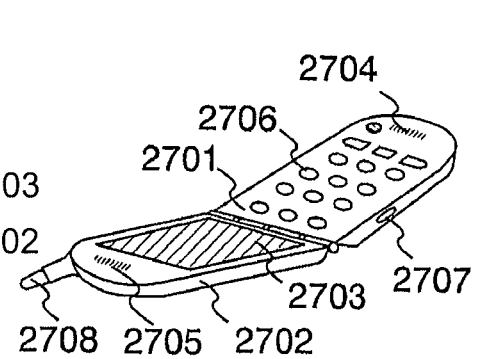

FIG. 9H is a mobile telephone, which is composed of a main body 2701, a frame 2702, a display portion 2703, an audio input portion 2704, an audio output portion 2705, operation keys 2706, an external connection port 2707, an antenna 2708, and the like. The pixel portion having a monitoring element of the invention is used for the display portion 2703 to manufacture the mobile telephone. Note that by displaying white characters on a black background, the display portion 2703 can suppress power consumption of the mobile telephone.

As described above, the application scope of the invention is so wide that it can be used in electronic apparatuses of various fields, particularly to a flat panel display.

[Embodiment]

[Embodiment 1]

Hereinafter explained is an experimental result with respect to a change of a cathode voltage (cathode potential) corresponding to a secular change and a current which is supplied to a light emitting element. Incidentally, this embodiment mode applies an experimental circuit to which a circuit as shown in FIG. 10 is applied.

Figure 12:
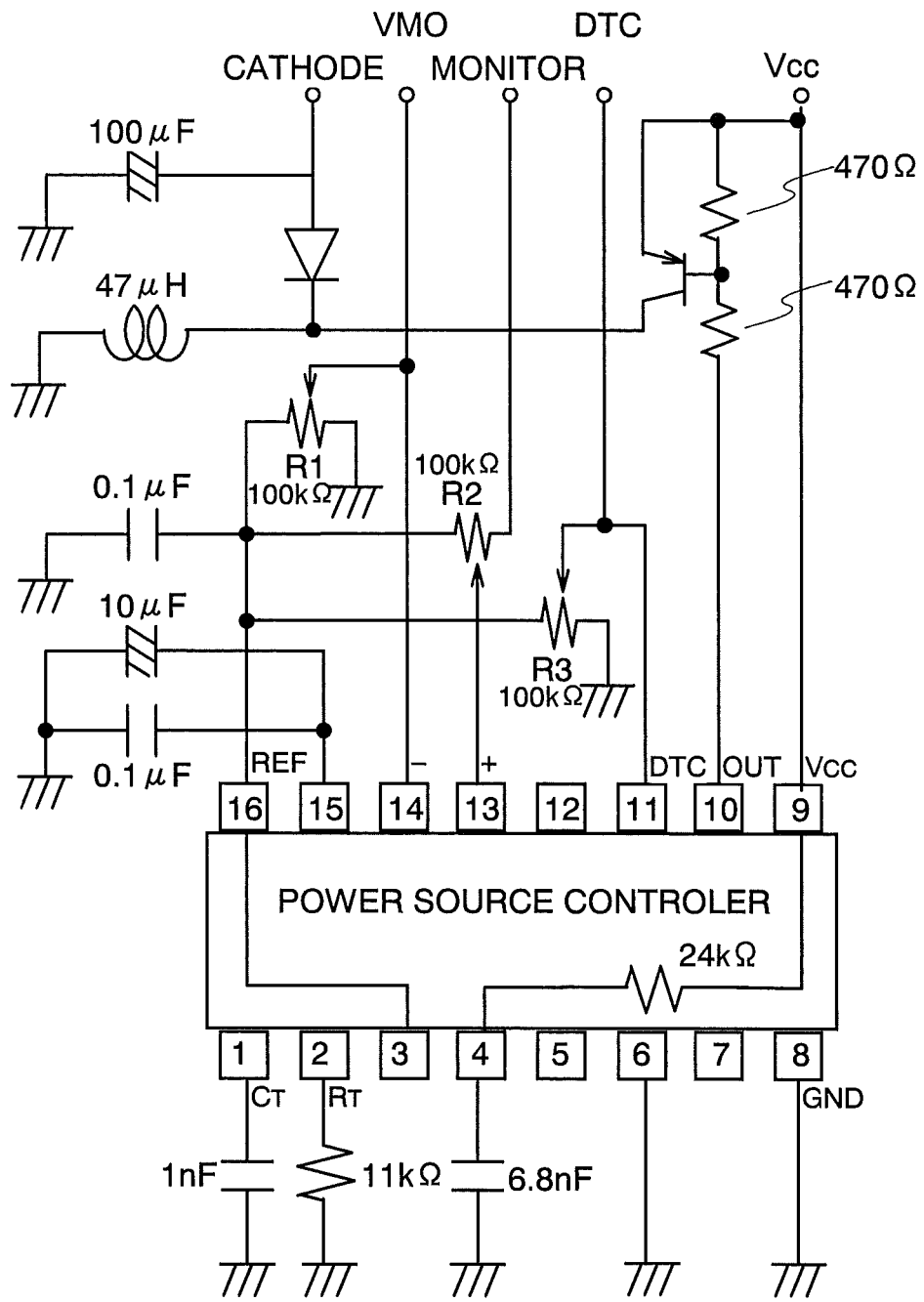
FIG. 12 is a view showing an experimental circuit of the invention.

FIG. 12 shows a circuit diagram of this embodiment to which a circuit diagram of FIG. 10 is applied. For a power source circuit, a μPC1100 (produced by NEC Corporation) is used. A resistance R1 is set so that a voltage of a VMO terminal can be approximately 1.05 to 1.45V. A resistance R2 is set so that a driver TFT of a monitoring element can operate in a saturation region. A resistance R3 is set so that a voltage of a DTC terminal can be approximately 1.87V. A power source voltage Vcc is set at a voltage of 7V. A CATHODE terminal is connected to a cathode of a light emitting element of a pixel and a cathode of a light emitting element of the monitoring element. A MONITOR terminal is connected to an anode of the light emitting element of the monitoring element. Meanwhile, second electrodes of driver TFTs of the pixel and the monitoring element and which are not connected to the light emitting elements are fixed at 5V.

Figure 13:
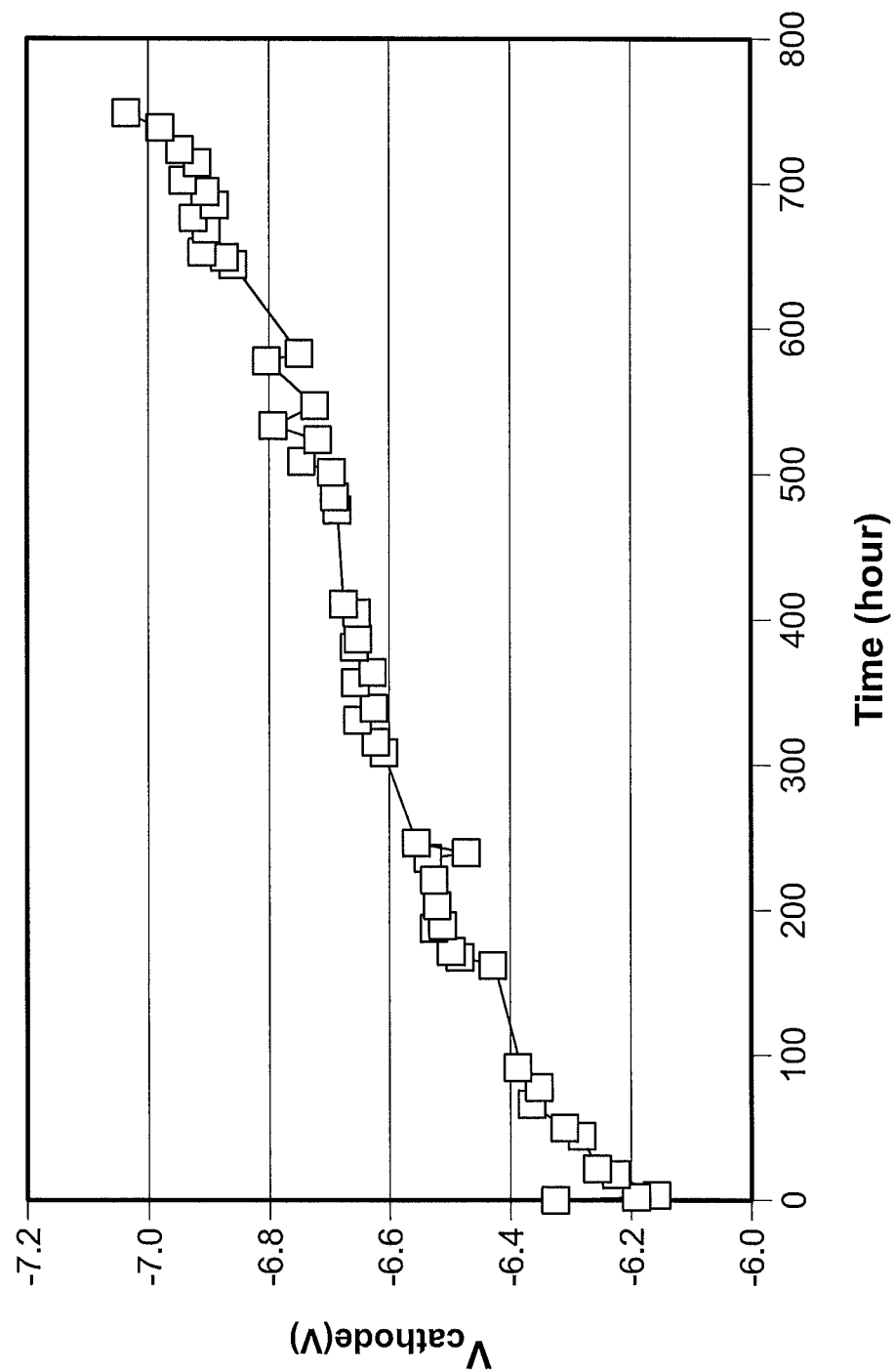
FIG. 13 is a chart showing a change of an anode potential ($V_{cathode}$) with the passage of time (hour).
Figure 14:
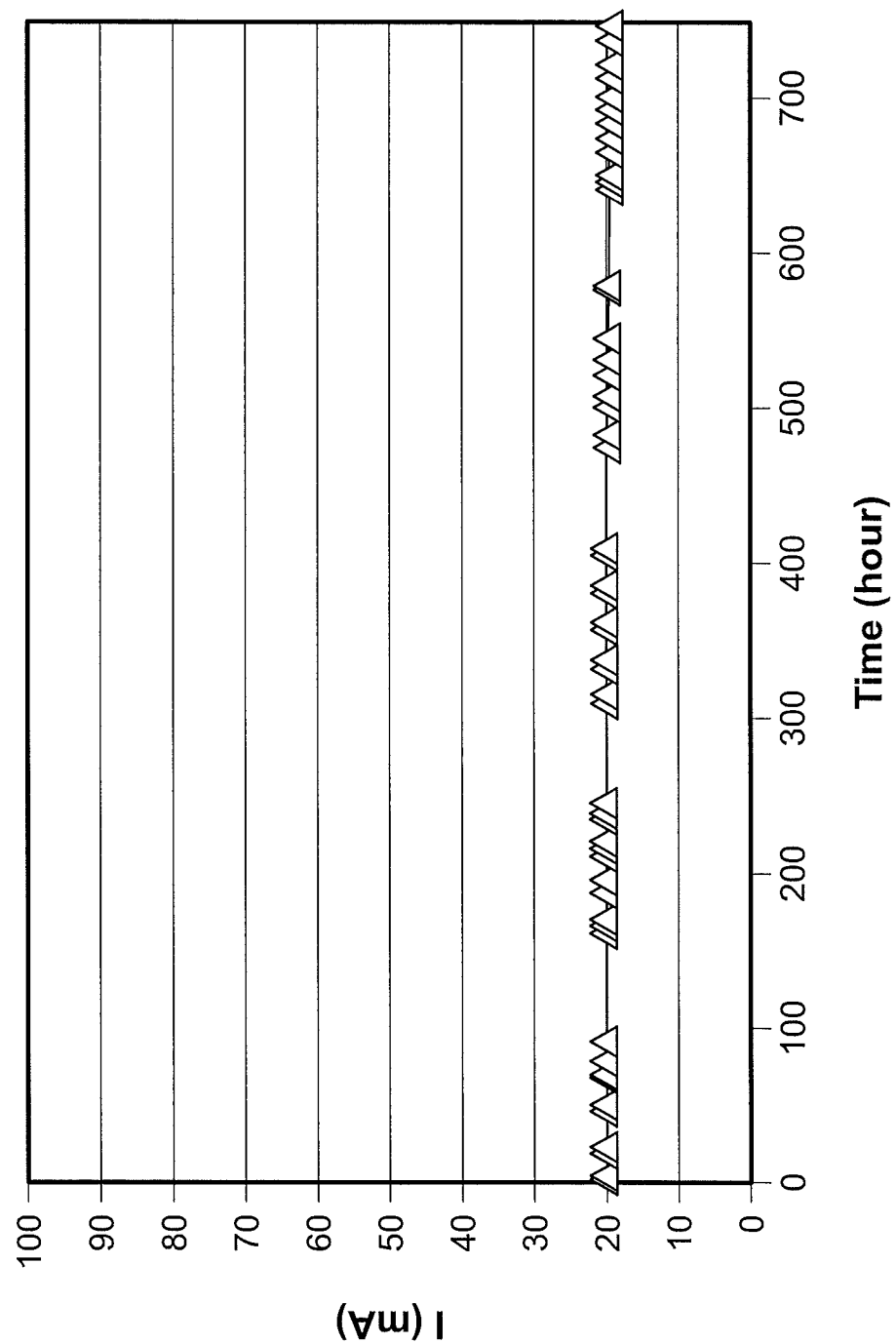
FIG. 14 is a chart showing a current value (I) which is supplied to a light emitting element with the passage of time (hour).

Shown in FIGS. 13 and 14 are the results of experiment conducted by using the circuit as shown in FIG. 12. FIG. 13 shows a change of a cathode potential ($V_{cathode}$) with the passage of time (hour). It can be confirmed that an absolute value of the cathode potential ($V_{cathode}$) rises as time passes. Meanwhile, FIG. 14 shows a current value (I) which is supplied to a light emitting element with the passage of time (hour). It can be confirmed that a constant current value is supplied to the light emitting element. Note that the current value supplied to the light emitting element is equal to the current consumption.

The longer the light emitting element emits light, the faster the light emitting element deteriorates and the higher the absolute value of the required cathode voltage becomes. However, the current value supplied to the light emitting element does not change. Accordingly, the circuit of the invention can control the cathode voltage normally in order to keep the current value supplied to the light emitting element constant.

By using the pixel structure provided with the circuit of the invention, it is possible to operate a diver TFT in a saturation region without a deterioration margin of the light emitting element, or with a smaller margin than the conventional one. Therefore, heat generation and power consumption can be reduced.

The invention makes it possible to set a voltage in a saturation region without a deterioration margin of a light emitting element, or with a smaller margin than the conventional one from the time the light emitting element starts emitting light. Therefore, the margin of the setting voltage in accordance with the deterioration of the light emitting element is not required, leading to the reduced heat generation and power consumption. Further, the deterioration of the light emitting element can be prevented particularly because heat generation of the driver transistor is reduced.

What is claimed is:

1. A display device comprising:
a first region comprising a pixel, the pixel comprising a first semiconductor film;
a second region comprising a second semiconductor film;
a first line overlapping the first semiconductor film and the second semiconductor film;
a second line overlapping the first line; and
a third line overlapping the first line,
wherein the first semiconductor film and the second semiconductor film have substantially a same shape,
wherein the second line is in contact with the first semiconductor film in a region where the second line overlaps the first semiconductor film, and
wherein the third line is not in contact with the second semiconductor film in a region where the third line overlaps the second semiconductor film.

2. The display device according to claim 1, wherein the first region is enclosed with the second region.

3. The display device according to claim 1, further comprising a third region comprising a monitoring element.

4. The display device according to claim 1,
wherein the first line is a scanning line,
wherein the second line is a first signal line, and
wherein the third line is a second signal line.

5. The display device according to claim 1,
wherein the second region comprises a dummy pixel, and
wherein the dummy pixel comprises the second semiconductor film.

6. An electronic apparatus comprising the display device according to claim 1 and an antenna.

7. A display device comprising:
a first region comprising a pixel, the pixel comprising a first semiconductor film;
a second region comprising a second semiconductor film;
a first line overlapping the first semiconductor film and the second semiconductor film;
a second line overlapping the first line; and
a third line overlapping the first line,
wherein the first semiconductor film and the second semiconductor film have substantially a same shape,
wherein the second line is in contact with the first semiconductor film in a region where the second line overlaps the first semiconductor film, and
wherein the third line is not in contact with the second semiconductor film in a region where the third line overlaps the second semiconductor film.

8. The display device according to claim 7, wherein the first region is enclosed with the second region.

9. The display device according to claim 7, further comprising a third region comprising a monitoring element.

10. The display device according to claim 7,
wherein the first line is a scanning line,
wherein the second line is a first signal line, and
wherein the third line is a second signal line.

11. The display device according to claim 7,
wherein the second region comprises a dummy pixel, and
wherein the dummy pixel comprises the second semiconductor film.

12. An electronic apparatus comprising the display device according to claim 7 and an antenna.

13. A display device comprising:
a first region comprising a pixel, the pixel comprising a first semiconductor film;
a second region comprising a second semiconductor film;
a first line overlapping the first semiconductor film and the second semiconductor film;
a second line overlapping the first line; and
a third line overlapping the first line,
wherein the first semiconductor film and the second semiconductor film have substantially a same shape,
wherein the first semiconductor film is a part of a transistor,
wherein a first part of the first line is a gate electrode of the transistor,
wherein a second part of the first line overlaps the second semiconductor film,
wherein the first part and the second part of the first line have substantially a same shape,
wherein a part of the second line overlaps the first semiconductor film,
wherein a part of the third line overlaps the second semiconductor film,
wherein the part of the second line and the part of the third line have substantially a same shape,
wherein the part of the second line is in contact with the first semiconductor film, and
wherein the part of the third line is not in contact with the second semiconductor film.

14. The display device according to claim 13, wherein the first region is enclosed with the second region.

15. The display device according to claim 13, further comprising a third region comprising a monitoring element.

16. The display device according to claim 13,
wherein the first line is a scanning line,
wherein the second line is a first signal line, and
wherein the third line is a second signal line.

17. The display device according to claim 13,
wherein the second region comprises a dummy pixel, and
wherein the dummy pixel comprises the second semiconductor film.

18. An electronic apparatus comprising the display device according to claim 13 and an antenna.

\* \* \* \* \*